United States Patent [19]
Mizuno

[11] Patent Number: 5,708,396
[45] Date of Patent: Jan. 13, 1998

[54] VOLTAGE CONTROLLED OSCILLATOR OF A RING OSCILLATOR TYPE THAT INCLUDES AN ODD NUMBER OF DELAY UNITS

[75] Inventor: Masayuki Mizuno, Tokyo, Japan

[73] Assignee: NEC Corporation, Tokyo, Japan

[21] Appl. No.: 514,560

[22] Filed: Aug. 14, 1995

[30] Foreign Application Priority Data

Aug. 12, 1994 [JP] Japan .................... 6-190453

[51] Int. Cl.⁶ ..................................... H03B 5/00
[52] U.S. Cl. ................ 331/57; 331/175; 327/264; 327/278; 327/393; 327/394; 327/276
[58] Field of Search ............ 331/57, 175, 116 FE; 327/261, 264, 276, 277, 278, 284, 285, 393, 394, 395, 396, 392, 398

[56] References Cited

U.S. PATENT DOCUMENTS

| | | | |
|---|---|---|---|
| 5,012,142 | 4/1991 | Sonntag | 331/57 X |
| 5,061,907 | 10/1991 | Rasmussen | 331/57 |
| 5,365,204 | 11/1994 | Angiulli | 331/57 |
| 5,434,525 | 7/1995 | Leonowich | 327/278 |
| 5,446,417 | 8/1995 | Korhonen et al. | 331/57 |

FOREIGN PATENT DOCUMENTS

| | | | |
|---|---|---|---|
| 2548191 | 2/1977 | Germany | 331/57 |
| 5-14136 | 1/1993 | Japan . | |

OTHER PUBLICATIONS

I.A. Young et al., "A PLL Clock Generator with 5 to 110 MHz of Lock Range for Microprocessors", IEEE Journal of Solid–State Circuits, vol. 27, No. 11, Nov. 1992, pp. 1599–1607.

*Primary Examiner*—Robert Pascal
*Assistant Examiner*—Arnold Kinkead
*Attorney, Agent, or Firm*—Foley & Lardner

[57] ABSTRACT

Disclosed is a voltage-controlled oscillator which has delay units 11A which have variable resistance circuits 111 and are connected in the form of a ring, and control signal lines 5, 6 for transmitting a control signal CG which can vary control gain. The variable resistance circuits 111 can vary the variation of resistance in response to the control signal CG.

6 Claims, 4 Drawing Sheets

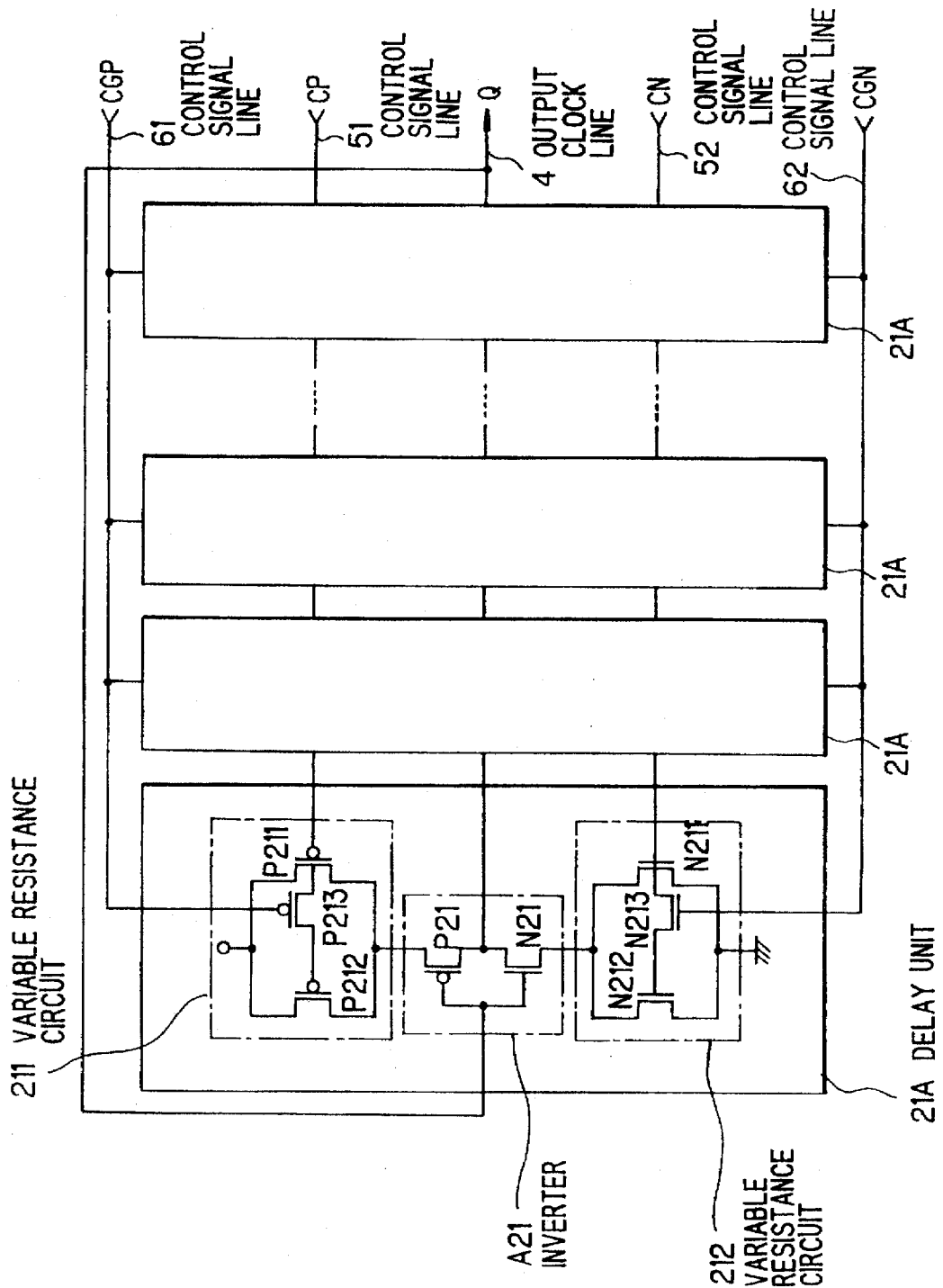

5,708,396

VOLTAGE CONTROLLED OSCILLATOR OF A RING OSCILLATOR TYPE THAT INCLUDES AN ODD NUMBER OF DELAY UNITS

FIELD OF THE INVENTION

This invention relates to a voltage-controlled oscillator (VCO), and more particularly to, a voltage-controlled oscillator of a ring oscillator type which can be suitably applied to a frequency source for a phase-locked loop (PLL) circuit.

BACKGROUND OF THE INVENTION

A conventional voltage-controlled oscillator of a ring oscillator type which includes a cascade connection of odd inverter circuits which control a propagation delay time is used as a frequency source for a PLL circuit in such as a frequency synthesizer, a digital audio interface, a communication apparatus or the like, since it has an excellent linear control voltage vs. oscillation frequency property.

However, the conventional voltage-controlled oscillator has a problem that the fluctuation of the high-frequency signal such as a spike noise induced on the control line affects the oscillation frequency and increases the temporal fluctuation of the frequency of the output signal, i.e., jitter when the variation of the oscillation frequency to the control signal voltage, i.e., control gain is large.

SUMMARY OF THE INVENTION

Accordingly, it is an object of the invention to provide a voltage-controlled oscillator in which a control gain in transient response is large and jittering of an output signal is sufficiently reduced.

It is a further object of the invention to provide a voltage-controlled oscillator in which an amount of control gain of the voltage-controlled oscillator and reduction of jittering of an output signal can be most suitably set by properly setting control property to control signals.

According to the invention, a voltage-controlled oscillator, comprises:

odd numbers of delay units which include inverting amplifier circuits and delay control circuits which control a delay time in response to a first control signal, wherein the odd numbers of delay units are connected in the form of a cascade and an input terminal of a first unit of the delay units and an output terminal of an end unit of the delay units are connected in the form of a ring, and wherein an oscillation frequency is controlled by controlling a delay time of the respective delay units, characterized in that:

the delay control circuit includes means for changing a delay-control sensitivity which corresponds to a variation of a delay time caused by changing of voltage level of the first control signal in response to a second control signal.

According to an another aspect of the invention, a voltage-controlled oscillator, comprises:

odd numbers of delay units which include inverting amplifier circuits each of which include a CMOS inverter circuit which comprises first and second MOS transistors of first and second conduction types respectively in which respective drains thereof are connected in series, and delay control circuits which control a delay time in response to first and second control signals which are regular and complementary signals respectively, wherein the odd numbers of delay units are connected in the form of a cascade and an input terminal of a first unit of the delay units and an output terminal of an end unit of the delay units are connected in the form of a ring, and wherein an oscillation frequency is controlled by controlling a delay time of the respective delay units, characterized in that:

the delay control circuit includes means for changing a delay-control sensitivity which corresponds to a variation of a delay time caused by changing of respective voltage level of the first and second control signals in response to respective third and fourth control signals which are regular and complementary signals respectively.

BRIEF DESCRIPTION OF THE DRAWINGS

The invention will be explained in more detail in conjunction with the appended drawings, wherein:

FIG. 4 is a circuit diagram showing a voltage-controlled oscillator in a second preferred embodiment of the invention.

DESCRIPTION OF THE PREFERRED EMBODIMENTS

Before explaining a voltage-controlled oscillator in the preferred embodiment, the aforementioned conventional voltage-controlled oscillator will be explained in FIGS. 1 and 2.

Figure 1:
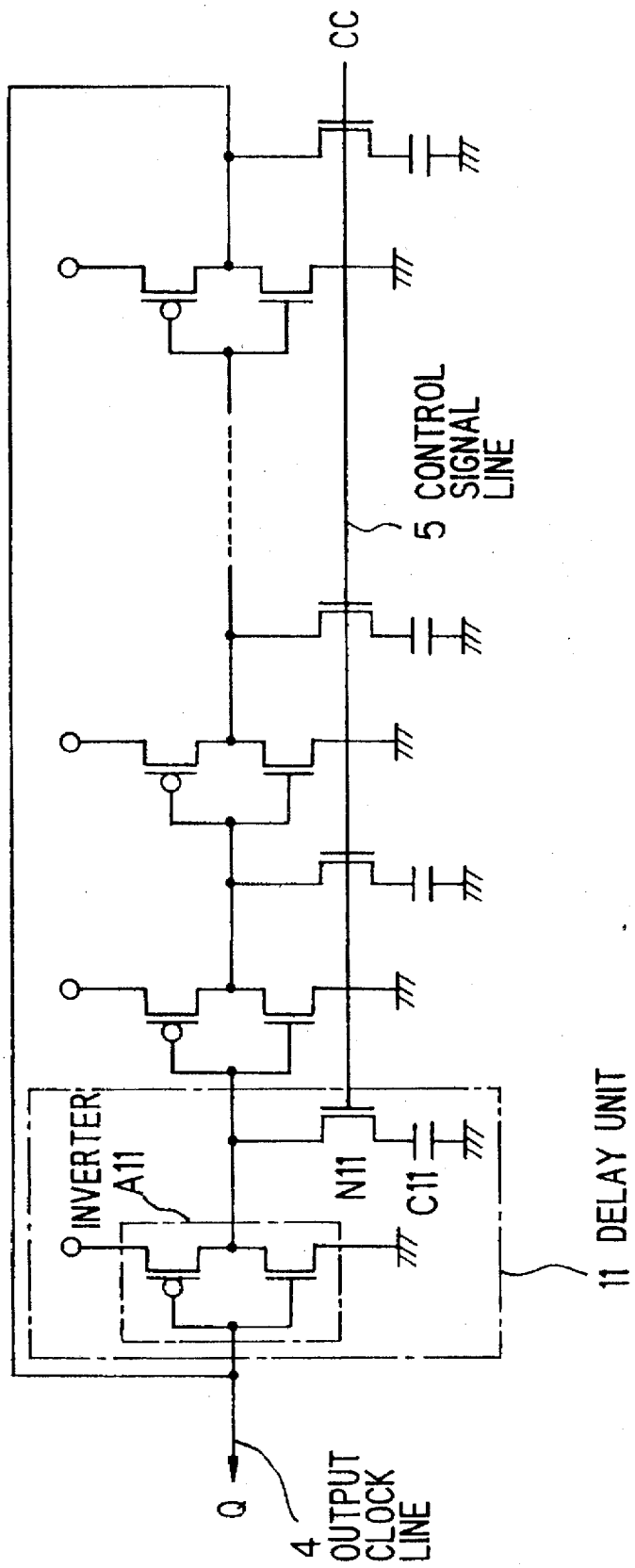
FIG. 1 is a circuit diagram showing a conventional voltage-controlled oscillator.

With reference to FIG. 1, the conventional voltage-controlled oscillator comprises odd numbers of delay units 11 which include inverter circuits A11 and are connected in the form of a cascade and in which the input terminal of the first unit and the output terminal of the end unit are connected in a ring shape and propagation delay time is controlled by voltage, and a control signal line 5 for transmitting a control signal CC which is connected to the delay control terminal of the respective delay units 11 to control delay time.

Each of the delay units 11 includes the inverter circuit A11 which is a CMOS type transistor in which a PMOS transistor and NMOS transistor are complementarily connected, a NMOS type transistor N11 in which the drain is connected to the output terminal of the inverter A11 and the gate is connected to the control signal line 5, and a capacitor C11 which is connected between the source of the transistor N11 and ground.

In operation, the conventional voltage-controlled oscillator as shown in FIG. 1 can control an oscillation frequency based on the voltage of the control signal and provide an output clock line 4 with an output signal Q when it has odd numbers of the delay units 11 as above-mentioned which are connected in the ring shape.

In the respective delay units 11, the inverter A11 operates as an amplifier unit, and the transistor N11 in which the drain is an input terminal, the gate is a control terminal and the source is an output terminal operates as a variable resistance element in which the resistance value in conducting state is controlled by the control signal CC which is provided through the control signal line 5. When the voltage of the control signal CC is low, the conducting resistance of the transistor N11 becomes high, resulting in that the capacitor C11 does not so affect the output capacitance of the inverter A11. Therefore, the delay time by the respective delay units 11 becomes shorter and the oscillation frequency is higher since in such ring type oscillator the frequency is inversely proportional to the product of the delay time of the respective delay units 11 and the number of the delay units 11. On the contrary, when the voltage of the control signal CC is increased, the conducting resistance of the transistor N11 becomes low, resulting in that the capacitor C11 affect much the output capacitance of the inverter A11 and that the output capacitance is equivalently increased. Therefore, the delay time by the respective delay units 11 becomes longer and the oscillation frequency is lower.

Figure 2:
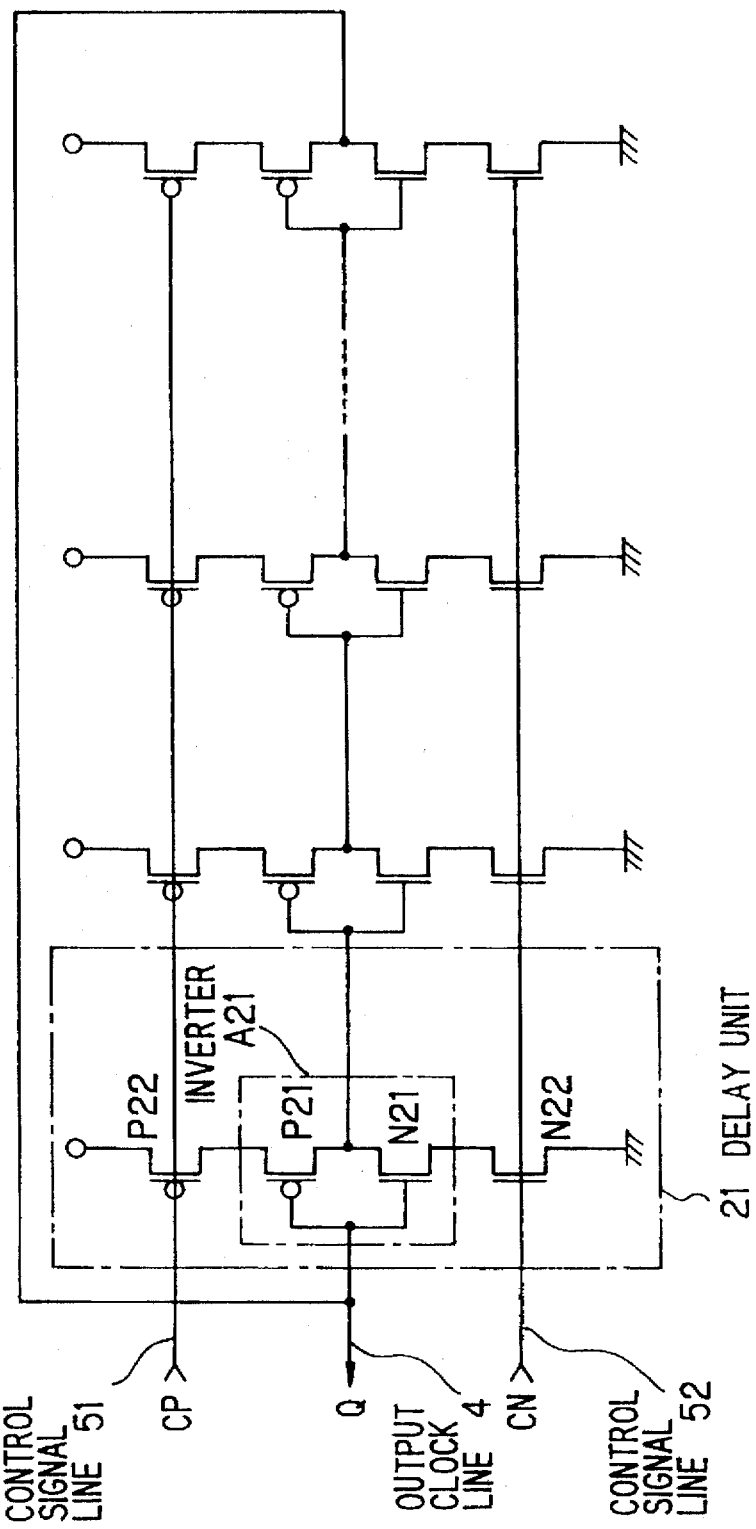
FIG. 2 is a circuit diagram showing an another conventional voltage-controlled oscillator.

On the other hand, Japanese patent application laid-open No. 5-14136 discloses another conventional VCO as shown in FIG. 2. The VCO comprises odd numbers of delay units 21 which include inverter circuits A21 and are connected in the form of a cascade and in which the input terminal of the first unit and the output terminal of the end unit are connected in a ring shape and propagation delay time is controlled by voltage, and control signal lines 51, 52 which are connected to the delay control terminals of the respective regular and complementary delay units 21 to control delay time and which transmit regular and complementary control signals CP, CN which are in reverse polarities to each other and have the same voltage.

Each of the delay units 21 includes the inverter circuit A21 which is a CMOS type transistor in which a PMOS transistor P21 and NMOS transistor N21 are complementarily connected, a transistor P22 in which the source is connected to the power supply and the drain is connected to the source of the transistor P21 and the gate is connected to the control signal line 51, and a transistor N22 which the source is connected to ground and the drain is connected to the source of the transistor N21 and the gate is connected to the control signal line 52.

In operation, the conventional voltage-controlled oscillator as shown in FIG. 2 can control an oscillation frequency based on the voltage of the control signals CP, CN and provide an output clock line 4 with an output signal Q when it has odd numbers of the delay units 21 as above-mentioned which are connected in the ring shape.

In the respective delay units 21, the inverter A21 operates as an amplifier unit, and the transistors P22, N22 in which the drains are input terminals, the gates are control terminals and the sources are output terminals operate as variable resistance elements in which the resistance value in conducting state is controlled by the control signals CP, CN which are provided through the control signal lines 51, 52. The delay time of the respective delay units A21 depends on the output capacitance of the inverter A21 and the discharging time of the charge which is accumulated in the next input capacitance (hereinafter referred to as 'accumulated charge'), and the discharging time depends on the respective conducting resistances of the transistors P22 and N22. When the voltage of the control signals CP, CN is low, the respective conducting resistances of the transistors P22, N22 becomes high, resulting in that the discharging time of the accumulated charge is longer. Therefore, the delay time by the respective delay units 21 becomes longer and the oscillation frequency is lower. On the contrary, when the voltage of the control signals CP, CN is increased, the respective conducting resistances of the transistors P22, N22 becomes low, resulting in that the discharging time of the accumulated charge is shorter. Therefore, the delay time by the respective delay units 21 becomes longer and the oscillation frequency is higher.

In the conventional voltage-controlled oscillators as above-mentioned, the fluctuation of the high-frequency signal such as a spike noise induced on the control line affects the oscillation frequency and increases jitter particularly when control gain is large.

Next, a voltage-controlled oscillator in the first preferred embodiment of the invention will be explained in FIG. 3, wherein like parts are indicated by like reference numerals as used in FIGS. 1.

Figure 3:
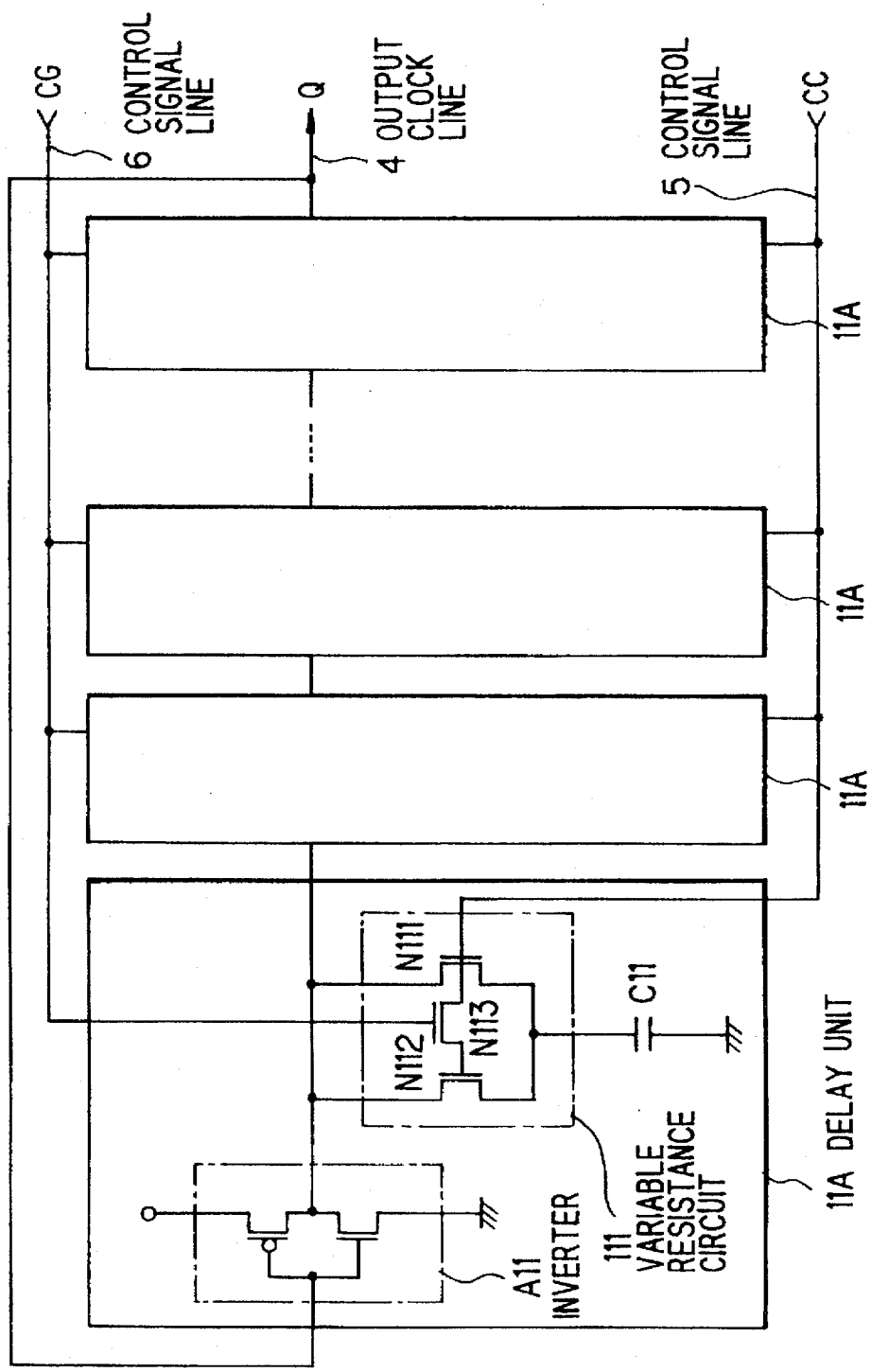
FIG. 3 is a circuit diagram showing a voltage-controlled oscillator in a first preferred embodiment of the invention.

In the first embodiment, as shown in FIG. 3, a voltage-controlled oscillator comprises delay units 11A which include a variable resistance circuit 111, in place of the conventional delay units which are connected in the form of a ring, and a control signal line 6 for transmitting a control signal CG which can vary control gain, in addition to a similar control line 5 to that shown in FIG. 1.

Each of the delay units 11A includes the variable resistance circuit 111 which can vary the variation of resistance in response to the control signal CG in place of the transistor Nil, in addition to a similar inverter A11 and capacitor C11 to that shown in FIG. 1.

The variable resistance circuit 111 includes a similar transistor N111 to the transistor N11 shown in FIG. 1, a transistor N112 in which the drain is connected to the output terminal of the inverter A11 and the source is connected to the capacitor C11, and a transistor N113 in which the drain is connected to the gate of the transistor N111 and the source is connected to the gate of the transistor N112 and the gate is connected to the control signal line 6.

In operation, the voltage-controlled oscillator in this embodiment operates in general similarly to that shown in FIG. 1 except for the operation of the variable resistance circuit 111 in the delay unit 11A.

In the variable resistance circuit 111, the conducting resistance of the transistor 113 is controlled in response to the voltage level of the control signal CG. When the voltage of the control signal CG is low, the conducting resistance of the transistor N113 is high and the control signal CC supplied to the gate of the transistor N112 through the transistor N113 is therefore reduced much. The transistor N112 is in the state of a low gain where the sensitivity to the control signal CC, i.e., control sensitivity is low. On the other hand, the transistor N111 operates with a similar control voltage/conducting resistance property to the transistor N11 in the prior-art delay unit 11, irrespective of the voltage level of the control signal CG. When the voltage level of the control signal CG increases, the conducting resistance of the transistor N113 is low and the control sensitivity of the transistor N112 is thereby higher to be in the state of a high gain. Since the transistors N111 and N112 are connected in parallel, the property of resistance variation of the variable resistance circuit 111 to the control signal CC, i.e., resistance control gain, in response to the voltage level of the control signal CG, can vary in the range from a minimum resistance control gain corresponding to the mutual conductance (gm) in only the transistor N111 to a maximum resistance control gain corresponding to the mutual conductance in the parallel connection of the transistors N111 and N112. Since the mutual conductance of the MOS transistor having the same structure depends on the size, for example, when the transistors N111 and N112 have the same structure and size, the ratio of low gain/high gain in the range of the gain variation is 2. When the size of the transistor N112 is designed larger than that of the transistor N111, the ratio in the range of the gain variation can be bigger.

The operation of the entire voltage-controlled oscillator will be explained below in detail. The voltage level of the control signal CG is risen to increase the resistance control gain of the variable resistance circuit 111 to the control signal CC. At this time, the variation of the oscillation frequency of entire voltage-controlled oscillator in response to the change of voltage level of the control signal CC, i.e., control gain becomes high. Thereby the oscillation frequency, the frequency of the output signal Q, in the initial synchronization of PLL circuit etc. can be fast converged on the predetermined frequency. When the frequency of the output signal Q comes near the predetermined value, the voltage level of the control signal CG is reduced to lower the control gain of the control signal CC. Thereby the affection of spike noise etc. reduced on the control signal line which causes the jitter of the output signal can be prevented as well as ensuring that the control gain necessary and sufficient for the stationary state in lock-in of the PLL circuit.

Furthermore, as mentioned above, by properly setting the control property of the transistors N111 to N113 to the respective control signals CC and CG, the amount of the control gain of the voltage-controlled oscillator and the reduction of jitter of the output signal Q can be most suitably set.

Third, a voltage-controlled oscillator in the second preferred embodiment of the invention will be explained in FIG. 4, wherein like parts are indicated by like reference numerals as used in FIGS. 2.

In the second embodiment, as shown in FIG. 4, a voltage-controlled oscillator comprises delay units 21A which include variable resistance circuits 211, 212, in place of the conventional delay units which are connected in the form of a ring, and control signal lines 61, 62 for transmitting regular and complementary control signals CGP, CGN which can vary control gain, in addition to similar control lines 51, 52 to that shown in FIG. 2.

Each of the delay units 21A includes the variable resistance circuit 211 which can vary the variation of resistance in response to the control signal CGP in place of the transistor P22, and the variable resistance circuit 212 which can vary the variation of resistance in response to the control signal CGN in place of the transistor N22, in addition to an inverter A21 of CMOS type which is similar to that shown in FIG. 2 and consists of the transistors P21, N21.

The variable resistance circuit 211 includes a similar transistor P211 to the transistor P22 shown in FIG. 2, a transistor P212 in which the drain is connected to the source of the transistor P21 and the source is connected to the power supply, and a transistor P213 in which the drain is connected to the gate of the transistor P211 and the source is connected to the gate of the transistor P212 and the gate is connected to the control signal line 61.

The variable resistance circuit 212 includes a similar transistor N211 to the transistor N22 shown in FIG. 2, a transistor N212 in which the drain is connected to the source of the transistor N21 and the source is connected to ground, and a transistor N213 in which the drain is connected to the gate of the transistor N211 and the source is connected to the gate of the transistor N212 and the gate is connected to the control signal line 62.

In operation, the voltage-controlled oscillator in this embodiment operates in general similarly to that shown in FIG. 2 except the operation of the variable resistance circuits 211,212 in the delay unit 21A.

The variable resistance circuit 212 has the same composition as the variable resistance circuit 111 in the first embodiment. Thus, if one reads the control signals CN and CGN for the control signals CC and CG, respectively, it is appreciated that the same operation is performed, i.e., the resistance control gain of the variable resistance circuit to the control signal CN can be varied by the voltage level of the control signal CGN. On the other hand, since the variable resistance circuit 212 has the same composition as the variable resistance circuit 211 except that the polarity is reversed, the same operation is performed when reading the control signals CP and CGP for the control signals CN and CGN, respectively.

Accordingly, by operation of the voltage-controlled oscillator in this embodiment, which is similar to that in the first embodiment, when a large control gain is required in the initial synchronization etc., the voltage of the control signals CGP, CGN is increased to enhance the control gain and in the stationary state such as lock-in it is reduced to lower the control gain, whereby the oscillation frequency can be fast converged and in the state of lock-in the occurring of jitter can be prevented.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A voltage-controlled oscillator, comprising odd numbers of delay units which include inverting amplifier circuits and delay control circuits which control a delay time in response to a first control signal, wherein said odd numbers of delay units are connected in a cascade arrangement and an input terminal of a first unit of said delay units and an output terminal of an end unit of said delay units are connected in a ring arrangement, and wherein an oscillation frequency is controlled by controlling a delay time of said respective delay units, characterized in that:

each of said delay control circuits includes means for changing a delay-control sensitivity which corresponds to a variation of a delay time caused by changing of a voltage level of said first control signal in response to a second control signal, wherein:

said means for changing said delay-control sensitivity comprises:

a variable resistance circuits which includes:

a first variable resistance element in which an input terminal thereof is connected to an output of said respective inverting amplifier circuits and a resistance value thereof is controlled by said first control signal supplied to a control terminal thereof;

a second variable resistance element in which an input terminal thereof is connected to an output of said respective inverting amplifier circuits and a resistance value thereof is controlled by a third control signal supplied to a control terminal thereof; and a third variable resistance element in which an input terminal thereof is connected to said control terminal of said first variable resistance element and an output terminal thereof is connected to said control terminal of said second variable resistance element and a resistance value thereof is controlled by said second control signal supplied to a control terminal thereof and which outputs said third control signal in response to supplying of said first control signal; and a capacitance which is connected between said respective outputs of said first and second variable resistance elements and a first power supply.

2. A voltage-controlled oscillator, according to claim 1, wherein:

each of said first, second and third variable resistance elements is a MOS transistor of a first conduction type in which a drain corresponds to said input terminal, a gate corresponds to said control terminal, and a source corresponds to said output terminal.

3. A voltage-controlled oscillator, comprising, odd numbers of delay units which include inverting amplifier circuits each of which include a CMOS inverter circuit which comprises first and second MOS transistors of first and second conduction types, respectively, in which respective drains thereof are connected in series, and delay control circuits which control a delay time in response to first and second control signals which are regular and complementary signals, respectively, wherein said odd numbers of delay units are connected in a cascade arrangement and an input terminal of a first unit of said delay units and an output terminal of an end unit of said delay units are connected in a ring arrangement, and wherein an oscillation frequency is controlled by controlling a delay time of said respective delay units, characterized in that:

each of said delay control circuits include means for changing a delay-control sensitivity which corresponds to a variation of a delay time caused by changing of a respective voltage level of said first and second control signals in response to respective third and fourth control signals, which are regular and complementary signals, respectively, wherein:

said means for changing said delay-control sensitivity comprises:

a first variable resistance circuit which includes:

a first variable resistance element in which an input terminal thereof is connected to a source of said first MOS transistor and an output terminal thereof is connected to a first power supply and a resistance value thereof is controlled by said first control signal supplied to a control terminal thereof;

a second variable resistance element in which an input terminal thereof is connected to a source of said first MOS transistor and an output terminal thereof is connected to said first power supply and a resistance value thereof is controlled by a third control signal supplied to a control terminal thereof; and a third variable resistance element in which an input terminal thereof is connected to said control terminal of said first variable resistance element and an output terminal thereof is connected to said control terminal of said second variable resistance element and a resistance value thereof is controlled by said second control signal supplied to a control terminal thereof and which outputs said third control signal in response to supplying of said first control signal; and a second variable resistance circuit which includes:

a fourth variable resistance element in which an input terminal thereof is connected to a source of said second MOS transistor and an output terminal thereof is connected to a second power supply and a resistance value thereof is controlled by said second control signal supplied to a control terminal thereof;

a fifth variable resistance element in which an input terminal thereof is connected to a source of said second MOS transistor and an output terminal thereof is connected to a second power supply and a resistance value thereof is controlled by a third control signal supplied to a control terminal thereof; and a sixth variable resistance element in which an input terminal thereof is connected to said control terminal of said fourth variable resistance element and an output terminal thereof is connected to said control terminal of said fifth variable resistance element and a resistance value thereof is controlled by said fourth control signal supplied to a control terminal thereof, which has a regular-complementary relation with said second control signal and which outputs said third control signal in response to supplying of said second control signal.

4. A voltage-controlled oscillator, according to claim 3, wherein:

each of said first, second and third variable resistance elements is a MOS transistor of a first conduction type in which a drain corresponds to said input terminal, a gate corresponds to said control terminal, and a source corresponds to said output terminal, and each of said fourth, fifth and sixth variable resistance elements is a MOS transistor of a second conduction type in which a drain corresponds to said input terminal, a gate corresponds to said control terminal, and a source corresponds to said output terminal.

5. A voltage-controlled oscillator, according to claim 1, wherein said first power supply is at a ground potential.

6. A voltage-controlled oscillator, according to claim 3, wherein said first power supply and said second power supply are both at a ground potential.

* * * * *